United States Patent
Park et al.

(10) Patent No.: US 11,038,142 B2
(45) Date of Patent: Jun. 15, 2021

(54) LIGHTING DEVICE AND DISPLAY APPARATUS

(71) Applicant: LG Display Co., Ltd., Seoul (KR)

(72) Inventors: JoonWon Park, Paju-si (KR);
MooChan Kang, Paju-si (KR);
Kunyoung Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/210,776

(22) Filed: Dec. 5, 2018

(65) Prior Publication Data

US 2019/0189956 A1 Jun. 20, 2019

(30) Foreign Application Priority Data

Dec. 15, 2017 (KR) ........................ 10-2017-0172830

(51) Int. Cl.
*H01L 51/52* (2006.01)
*H01L 51/56* (2006.01)
*H01L 27/32* (2006.01)

(52) U.S. Cl.
CPC ...... *H01L 51/5246* (2013.01); *H01L 51/5256* (2013.01); *H01L 51/56* (2013.01); *H01L 27/3244* (2013.01); *H01L 51/5259* (2013.01); *H01L 2251/5361* (2013.01)

(58) Field of Classification Search
CPC .................................................. H01L 51/5246
USPC .......................................................... 257/40
See application file for complete search history.

(56) References Cited

U.S. PATENT DOCUMENTS

| | | |
|---|---|---|
| 2003/0203551 A1 | 10/2003 | Cok et al. |
| 2005/0269926 A1* | 12/2005 | Fukuoka ............. H01L 51/5246 313/123 |
| 2011/0234477 A1 | 9/2011 | Sano et al. |
| 2013/0334959 A1* | 12/2013 | Wang ................. H01L 51/5256 313/512 |
| 2014/0131682 A1 | 5/2014 | Kim et al. |
| 2014/0319474 A1 | 10/2014 | Kim et al. |
| 2016/0064690 A1 | 3/2016 | Kook et al. |
| 2016/0095172 A1 | 3/2016 | Lee et al. |
| 2016/0285038 A1 | 9/2016 | Kim |
| 2017/0033312 A1 | 2/2017 | Kim et al. |

(Continued)

FOREIGN PATENT DOCUMENTS

| | | |
|---|---|---|
| CN | 105374947 B | 3/2016 |
| KR | 10-2006-0104793 A | 10/2006 |

(Continued)

OTHER PUBLICATIONS

The Intellectual Property Office of the United Kingdom, Examination Report, GB Patent Application No. GB1820425.5, dated Jan. 20, 2020, three pages.

*Primary Examiner* — Hsin Yi Hsieh
(74) *Attorney, Agent, or Firm* — Fenwick & West LLP

(57) ABSTRACT

A lighting device includes a substrate having a light emitting area and a non-light emitting area surrounding the light emitting area, a light emitting part in the light emitting area, a first inorganic layer on the light emitting part and the non-light emitting area, a first organic layer on the first inorganic layer overlapping the light emitting part, a second inorganic layer on the first organic layer, a protruding part on the first inorganic layer of the non-light emitting area, and a cover layer on the protruding part.

20 Claims, 7 Drawing Sheets

(56) References Cited

U.S. PATENT DOCUMENTS

2017/0331073 A1* 11/2017 Choi ................... H01L 51/5256
2018/0040848 A1* 2/2018 Hirase ................... H05B 33/04
2018/0233700 A1* 8/2018 Li ....................... H01L 51/5246
2019/0157618 A1* 5/2019 Park .................... H01L 51/5259

FOREIGN PATENT DOCUMENTS

| KR | 10-2011-0012432 A | 2/2011 |
| KR | 10-2011-0050985 A | 5/2011 |
| KR | 10-2011-0131381 A | 12/2011 |
| WO | WO 2016/132954 A1 | 8/2016 |
| WO | WO 2018/133147 A1 | 7/2018 |

* cited by examiner

LIGHTING DEVICE AND DISPLAY APPARATUS

CROSS-REFERENCE TO RELATED APPLICATIONS

This application claims priority to Republic of Korea Patent Application No. 10-2017-0172830, filed on Dec. 15, 2017, which is incorporated by reference in its entirety.

BACKGROUND

Field of Technology

The present disclosure relates to a lighting device, a display apparatus, and a manufacturing method thereof, and more particularly, to a lighting device and a display apparatus including organic light emitting diode and having excellent moisture blocking ability, and a manufacturing method thereof.

Discussion of the Related Art

Recently, display apparatuses for visually expressing electrical information signals have rapidly advanced, and in line with this, various display apparatuses which are reduced in thickness and weight and have excellent performance of low power consumption have been developed.

Specific examples of such a display apparatus include a liquid crystal display (LCD), a plasma display panel (PDP), a field emission display (FED), an organic light emitting display, and the like.

Among them, the organic light emitting display has a fast response speed, high luminous efficiency, high brightness, and an excellent viewing angle as compared with other displays, and thus, its application has been expanded. An organic light emitting diode (OLED) applied to an organic light emitting display is a light source having a self-luminance characteristic and has excellent advantages in terms of a viewing angle, a contrast, a response speed, power consumption, and the like, as compared with liquid crystal. Further, since the organic light emitting diode has a surface light emitting structure, it is easy to realize a flexible form.

In recent years, based on many advantages of the organic light emitting diode, research for using an organic light emitting diode as a light source for a lighting device or a display apparatus has been actively conducted.

Meanwhile, as the importance of a design of vehicles has increased, various lamps have been used in vehicles. For example, a surface light source and a point light source are applied to a lighting device of a vehicle, such as an interior light of a vehicle or a headlight, a fog lamp, a retract lamp, a sidelight, a number light, a tail lamp, a brake light, and a turn signal lamp, a hazard flasher lamp, and the like. Since organic light emitting diodes represent various colors and consume less power, the organic light emitting diodes are used as light sources of lighting devices of vehicles.

However, since a lighting device used in a vehicle is exposed to severe conditions, moisture ($H_2O$), oxygen ($O_2$), and the like, may penetrate into the lighting device. Since the organic light emitting diode is vulnerable to moisture ($H_2O$) and oxygen ($O_2$), it is necessary to protect the organic light emitting diode from an external environment such as moisture ($H_2O$), and oxygen ($O_2$), and the like, to use the organic light emitting diode in a lighting device of a vehicle, or the like.

SUMMARY

Accordingly, the present disclosure is directed to providing a lighting device, a display apparatus, and a manufacturing method thereof that substantially obviate one or more problems due to limitations and disadvantages of the related art.

An aspect of the present disclosure is directed to providing a lighting device and a display apparatus in which penetration of moisture ($H_2O$), and oxygen ($O_2$), and the like, may be effectively blocked.

Another aspect of the present disclosure is directed to providing a lighting device and a display apparatus in which an organic light emitting diode is used as a light source and damage to the organic light emitting diode is prevented by effectively blocking penetration of moisture ($H_2O$), and oxygen ($O_2$), and the like.

Another aspect of the present disclosure is directed to providing a manufacturing method of a lighting device and a display apparatus, which effectively blocks penetration of moisture ($H_2O$), and oxygen ($O_2$), and the like.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a lighting device including a substrate having a light emitting area and a non-light emitting area surrounding the light emitting area, a light emitting part on the light emitting area, a first inorganic layer on the light emitting part and the non-light emitting area, a first organic layer on the first inorganic layer overlapping the light emitting part, a second inorganic layer on the first organic layer, a protruding part on the first inorganic layer of the non-light emitting area, and a cover layer on the protruding part.

The light emitting part may include at least one organic light emitting diode.

The lighting device may further include a dam part on the non-light emitting area.

The dam part may be disposed between the substrate and the first inorganic layer.

The dam part may have a height greater than a height of the light emitting part.

The dam part may include a first dam surrounding the light emitting part in plan view, and a second dam spaced apart from the first dam and surrounding the first dam.

The first dam may define a disposition area of the first organic layer.

The first inorganic layer and the second inorganic layer may be in direct contact with each other in the non-light emitting area.

The protruding part may include a polymer resin and a moisture absorbent dispersed in the polymer resin.

The protruding part may surround the light emitting part.

The protruding part may be disposed on the second inorganic layer.

The protruding part may be disposed between the first dam and the second dam.

The lighting device may further include an adhesive layer between the protruding part and the cover layer.

The lighting device may further include a primer layer between the protruding part and the adhesive layer.

In another aspect of the present disclosure, there is provided a display apparatus including a substrate having a light emitting area and a non-light emitting area surrounding the light emitting area, a display part on the light emitting area, a first inorganic layer on the display part and the non-light emitting area, a first organic layer on the first inorganic layer overlapping the display part, a second inorganic layer on the first organic layer, a protruding part on the first inorganic layer of the non-light emitting area, and a cover layer on the protruding part, wherein the display part includes a plurality of organic light emitting diodes.

The display apparatus may further include a dam part on the non-light emitting area.

The display apparatus may further include an adhesive layer between the protruding part and the cover layer.

The display apparatus may further include: a primer layer between the protruding part and the adhesive layer.

An embodiment of the present disclosure relates to a lighting device including a substrate having a light emitting area where light is emitted and a non-light emitting area that does not emit light, with the non-light emitting area surrounding the light emitting area. The lighting device also includes a light emitting part on the light emitting area, the light emitting part emitting light, a first inorganic layer on both the light emitting part and the non-light emitting area, a first organic layer on the first inorganic layer, the first organic layer overlapping the light emitting part, a second inorganic layer on the first organic layer, a protruding part on the first inorganic layer of in the non-light emitting area, but not in the light emitting area, and a cover layer on the protruding part. The height of the protruding part may be greater than or equal to a height of the light emitting part.

An embodiment of the present disclosure relates to a display apparatus including a substrate having a light emitting area where light is emitted and a non-light emitting area that does not emit light, with the non-light emitting area surrounding the light emitting area. The display apparatus also includes a display part on the light emitting area, the display part emitting light, a first inorganic layer on both the display part and the non-light emitting area, a first organic layer on the first inorganic layer, the first organic layer overlapping the display part, a second inorganic layer on the first organic layer, a protruding part on the first inorganic layer in the non-light emitting area, but not in the light emitting area, and a cover layer on the protruding part. A height of the protruding part is greater than or equal to a height of the display part. The display part includes a plurality of organic light emitting diodes.

An embodiment of the present disclosure relates to a lighting device including a substrate, a light emitting part on the substrate, with the light emitting part overlapping a portion of the substrate, an encapsulation layer on the light emitting part, a plurality of protruding parts on the substrate, including a first protruding part and a second protruding part. The first protruding part surrounds the light emitting part and non-overlapping the light emitting part. The second protruding part surrounds the first protruding part and the light emitting part, the second protruding part non-overlapping with the first protruding part and the light emitting part. The first protruding part and the second protruding part may have a height greater than or equal to a height of the light emitting part.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
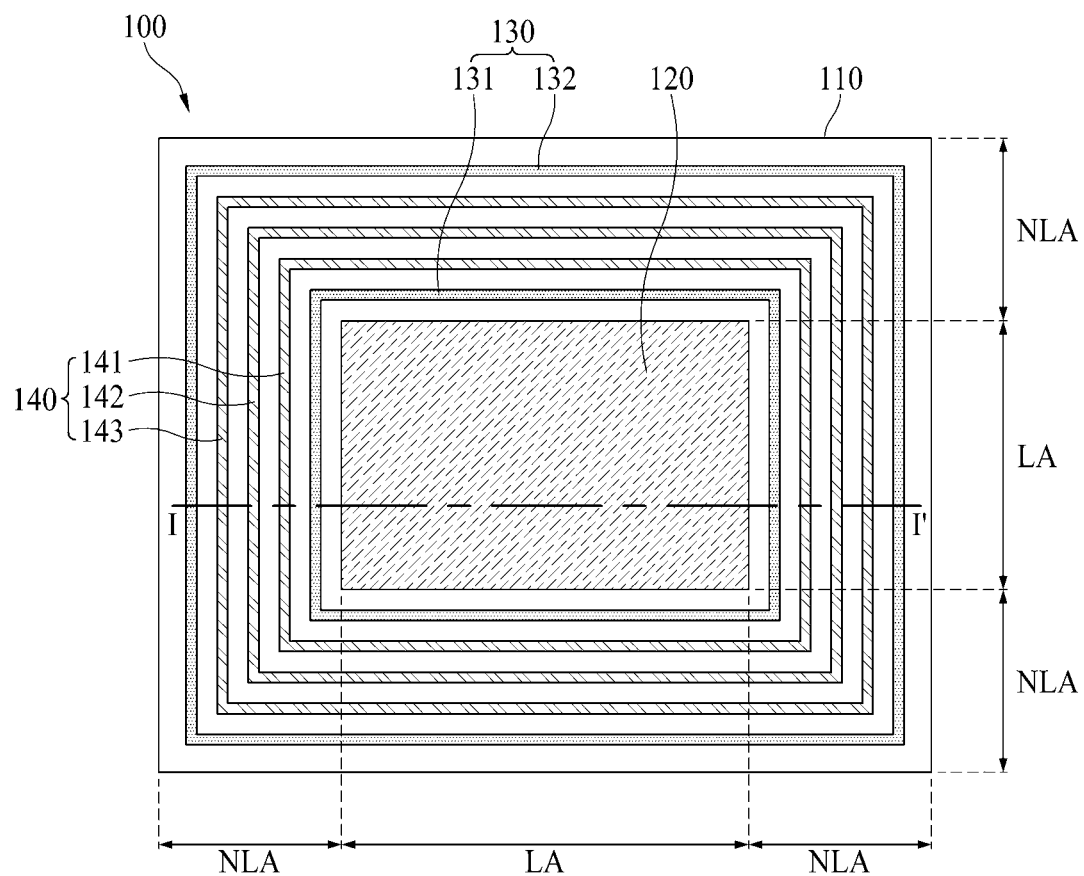
FIG. 1 is a plan view of a lighting device according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~' and 'next~', one or more other parts may be disposed between the two parts unless 'just' or 'direct' is used. In this disclosure below, when one part (or element, device, etc.) is referred to as being disposed "on" another part (or element, device, etc.), this includes a case where the one part contacts the other part and a case where another part is provided between two parts. In the present specification, when it is described that one comprises (or includes or has) some elements, it should be understood that it may comprise (or include or has) only those elements, or it may comprise (or include or have) other elements as well as those elements if there is no specific limitation.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings. In the specification, in adding reference numerals for elements in each drawing, it should be noted that like reference numerals already used to denote like elements in other drawings are used for elements wherever possible.

Figure 2:
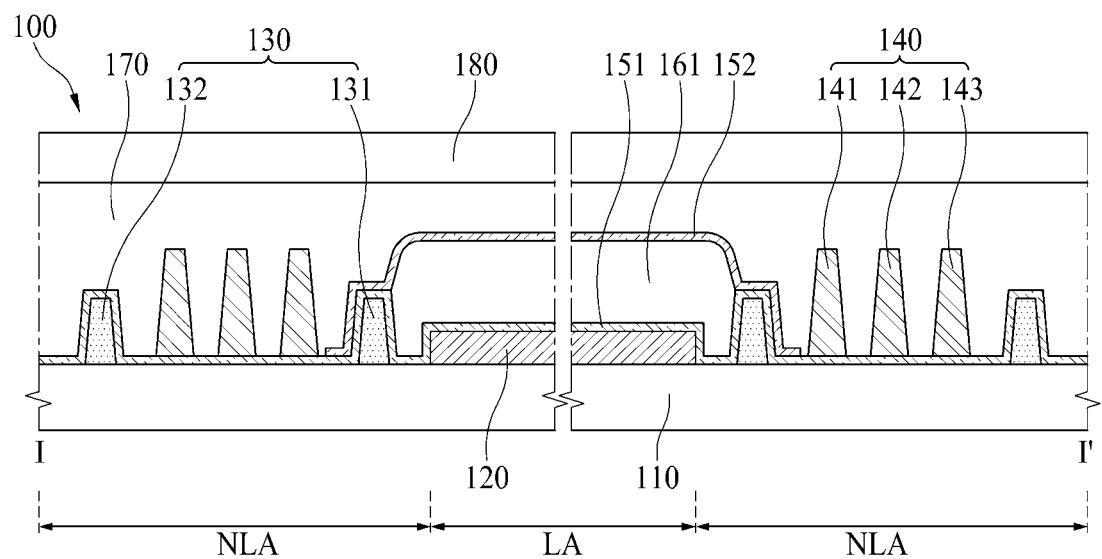
FIG. 2 is a cross-sectional view taken along line I-I' of FIG. 1.

FIG. 1 is a plan view of a lighting device 100 according to an embodiment of the present disclosure, and FIG. 2 is a cross-sectional view taken along line I-I' of FIG. 1.

The lighting device 100 according to an embodiment of the present disclosure includes a substrate 110 having a light emitting area LA and a non-light emitting area NLA around the light emitting area LA, a light emitting part 120 on the light emitting area LA, a first inorganic layer 151 on the light emitting part 120 and the non-light emitting area NLA, a first organic layer 161 on the first inorganic layer 151 overlapping the light emitting part 120, a second inorganic layer 152 on the first organic layer 161, a protruding part 140 on the first inorganic layer 151 in the non-light emitting area NLA, and a cover layer 180 on the protruding part 140.

Glass or plastic may be used for the substrate 110. Transparent plastic having flexibility, e.g., polyimide, may be used as the plastic. When polyimide is used as the substrate 110, heat-resistant polyimide that may withstand high temperatures may be used in consideration of the fact that a high-temperature deposition process is performed on the substrate 110. However, the present disclosure is not limited thereto, and a substrate 110 formed of a metal may also be used.

According to an embodiment of the present disclosure, the non-light emitting area NLA surrounds the light emitting area LA of the substrate 110.

The light emitting part 120 is disposed on the light emitting area LA of the substrate 110. According to an embodiment of the present disclosure, the light emitting part 120 includes at least one organic light emitting diode 190. More specifically, the light emitting part 120 may include one organic light emitting diode 190 or a plurality of organic light emitting diodes 190.

Figure 3:
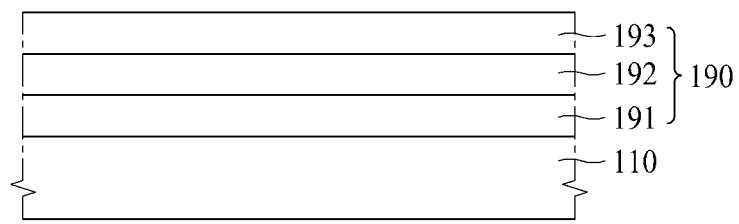
FIG. 3 is a schematic cross-sectional view of an organic light emitting diode.

FIG. 3 is a schematic cross-sectional view of an organic light emitting diode 190.

The organic light emitting diode 190 includes a first electrode 191 on the substrate 110, an organic layer 192 on the first electrode 191, and a second electrode 193 on the organic layer 192.

Although not shown, a buffer layer may be disposed on the substrate 110, and the first electrode 191 may be disposed on the buffer layer. The buffer layer may planarize an upper surface of the substrate 110 and protect the organic light emitting diode 190.

The first electrode 191 serves as an anode, and the second electrode 193 serves as a cathode. However, the present disclosure is not limited thereto, and the polarities of the first electrode 191 and the second electrode 193 may be the opposite.

In a bottom emission type in which light is emitted in the direction towards the substrate 110, the first electrode 191 may be a transparent electrode and the second electrode 193 may be a reflective electrode. In this case, the first electrode 191 may be formed of ITO, IZO, ZnO, or $In_2O_3$ having a large work function, and the second electrode 193 may be formed of a metal having a small work function, for example, Ag, Mg, Al, Pt, Pd, Au, Ni, Nd, Ir, Cr, Li, Ca, and the like.

In a top emission type in which light is emitted in the direction toward the second electrode 193, the first electrode 191 may be a reflective electrode and the second electrode 193 may be a transparent electrode. Here, the first electrode 191 may include a reflective film formed of Ag, Mg, Al, Pt, Pd, Au, Ni, Nd, Ir, Cr, Li, Ca, and a compound thereof and a light-transmissive layer formed of ITO, IZO, ZnO, $In_2O_3$, or the like having a large work function. The second electrode 193 may include a thin film formed of a metal having a small work function such as Ag, Mg, Al, Pt, Pd, Au, Ni, Nd, Ir, Cr, Li, Ca, and the like, and a light-transmissive layer or an auxiliary line formed of ITO, IZO, ZnO, $In_2O_3$, or the like.

In the case of a double-sided emission type, both the first electrode 191 and the second electrode 193 may be transparent electrodes.

The organic layer 192 is disposed between the first electrode 191 and the second electrode 193 and includes at least one light emitting layer. More specifically, the organic layer 192 may include one organic light emitting layer and may include two or more organic light emitting layers stacked vertically. The organic layer 192 may further include at least one of a hole injection layer (HIL), a hole transport layer (HTL), an electron transport layer (ETL), and an electron injection layer. The organic layer 192 may emit light of any one of red, blue, and green, or may emit white light.

Although not shown, a capping layer may be disposed on the second electrode 193 to protect the organic light emitting diode 190. The capping layer protects the organic light emitting diode 190 in the process of forming an organic layer, an inorganic layer, and the like, on the light emitting part 120.

The light emitting part 120 may include one or more lines (not shown) for driving the organic light emitting diode 190 and may further include an auxiliary line (not shown).

Referring to FIGS. 1 and 2, a dam part 130 is disposed on a non-light emitting area NLA of a substrate 110. The dam part 130 includes a first dam 131 and a second dam 132 spaced apart from each other. The first dam 131 surrounds the light emitting part 120 in the plan view and the second dam 132 is spaced apart from the first dam 131 and surrounds the first dam 131.

The first dam 131 and the second dam 132 may be formed of an organic or inorganic material having shape stability and insulation properties. For example, the first dam 131 and the second dam 132 may each include at least one of a polymer resin, silicon oxide, silicon nitride, metal oxide, and metal nitride. The first dam 131 and the second dam 132 may include a moisture absorbent (or getter).

The first dam 131 defines a disposition area of the first organic layer 161 (to be described later). In the process of forming the first organic layer 161, the first dam 131 serves as a dam for limiting flow of an organic material for forming the first organic layer 161. Accordingly, the first organic layer 161 may be disposed inside a region defined by the first dam 131.

The first dam 131 and the second dam 132 may serve as a barrier for blocking inflow of moisture or oxygen, which is introduced from the outside, to the light emitting part 120.

According to an embodiment of the present disclosure, the dam part 130 has a height greater than that of the light emitting part 120. Since the first dam 131 has a height greater than that of the light emitting part 120, the first dam 131 may easily limit flow of an organic material for forming the first organic layer 161. Also, since the first dam 131 and the second dam 132 have a height greater than that of the light emitting part 120, they may act as obstacles in movement of moisture or oxygen introduced from the outside. Accordingly, the dam part 130 may impede moisture or oxygen from reaching the light emitting part 120.

FIGS. 1 and 2 illustrate that the dam part 130 has the first dam 131 and the second dam 132. However, the present disclosure is not limited thereto and the dam part 130 may have three or more dams.

The first inorganic layer 151 is disposed on the light emitting part 120 and the non-light emitting area NLA. Referring to FIG. 2, the first inorganic layer 151 is also disposed on the dam part 130. Therefore, it may be considered that the dam part 130 is disposed between the substrate 110 and the first inorganic layer 151. Since the first organic layer 151 is disposed on the dam part 130, the first organic layer 161 may be disposed between the first inorganic layer 151 and the second inorganic layer 152.

The first inorganic layer 151 may be formed of a silicon oxide, a silicon nitride, a metal oxide, or a metal nitride through a method such as sputtering, chemical vapor deposition (CVD), ion beam assisted deposition (IBAD), and the like. The first inorganic layer 151 may be formed of a material selected from among, for example, calcium oxide, alumina, silica, titania, indium oxide, tin oxide, silicon oxide, silicon nitride, and aluminum nitride but the material is not limited to the above examples.

The first inorganic layer 151 has excellent moisture and oxygen blocking ability and thus protects the light emitting part 120 from moisture and oxygen.

The first organic layer 161 is disposed on the first inorganic layer 151 overlapping the light emitting part 120. The first organic layer 161 overlaps the light emitting part 120 in the plan view.

The first organic layer 161 may be formed by coating a liquid monomer or depositing vaporized monomer, and subsequently curing a coated or deposited monomer layer by heat or light (e.g., ultraviolet light). More specifically, the first organic layer 161 may be formed by an ink-jet method.

The first organic layer 161 may be formed of any one of an acrylic resin, a methacrylic resin, a polyester resin, a PET resin, a polyethylene resin, or a polypropylene resin, or a mixture thereof. However, the material for forming the first organic layer 161 is not limited thereto, and any other known organic layer forming material may be used for forming the first organic layer 161.

The first organic layer 161 serves to provide flexibility to the lighting device 100 and covers the particles remaining on the light emitting part 120 after the light emitting part 120 is formed, thus preventing the particles from protruding upwards from the first light-emitting layer 120. Therefore, the first organic layer 161 is also referred to as a particle cover layer (PCL).

In order to improve the moisture and oxygen blocking ability, the first organic layer 161 may include a moisture absorbent or a getter.

The second inorganic layer 152 is disposed on the first organic layer 161. The second inorganic layer 152 completely covers an upper surface of the first organic layer 161. Therefore, the second inorganic layer 152 has an area greater than the first organic layer 161 in the plan view.

The second inorganic layer 152 may be formed of silicon oxide, silicon nitride, metal oxide, or metal nitride by a method such as sputtering, CVD, or IBAD, like the first inorganic layer 151. The second inorganic layer 152 may be formed using a material selected from among, for example, calcium oxide, alumina, silica, titania, indium oxide, tin oxide, silicon oxide, silicon nitride and aluminum nitride, but a material thereof is not limited to the above examples. The second inorganic layer 152 may be formed of the same material as that of the first inorganic layer 151 or may be formed of a different material.

Referring to FIG. 2, the second inorganic layer 152 is disposed on a portion of the first inorganic layer 151. In the plan view, the first inorganic layer 151 has an area larger than the second inorganic layer 152. However, the present disclosure is not limited thereto and the second inorganic layer 152 may cover the entire surface of the first inorganic layer 151 in the plan view. For example, the first inorganic layer 151 and the second inorganic layer 152 may have the same area, or the second inorganic layer 152 may have an area larger than the first inorganic layer 151.

Also, referring to FIG. 2, the first inorganic layer 151 and the second inorganic layer 152 are in contact with each other in the non-light emitting area NLA. Accordingly, a space sealed by the first inorganic layer 151 and the second inorganic layer 152 is formed, and a structure in which the first organic layer 161 is disposed in the sealed space is formed.

Since the first inorganic layer 151 and the second inorganic layer 152 have excellent moisture and oxygen blocking ability and the first organic layer 161 has flexibility and particle covering ability, the light emitting part 120 may be effectively protected by a stacked structure of the first inorganic layer 151, the first organic layer 161, and the second inorganic layer 152. The stacked structure of the first inorganic layer 151, the first organic layer 161, and the second inorganic layer 152 is also referred to as an encapsulation structure or an encapsulation layer.

However, when the lighting device 100 according to an embodiment of the present disclosure is used under adverse conditions in which it is exposed to snow, rain, high temperature, or high humidity, moisture or oxygen may penetrate into the light emitting part 120 along an interface between the layers constituting the lighting device 100. For example, when the lighting device 100 according to an embodiment of the present disclosure is used for lighting a vehicle, or the like, the possibility that the light emitting part 120 is damaged by moisture or oxygen introduced from the external environment may increase.

In order to efficiently protect the light emitting part 120 under such adverse conditions, the lighting device 100 according to an embodiment of the present disclosure includes the protruding part 140.

Referring to FIGS. 1 and 2, the protruding part 140 is disposed on the first inorganic layer 151. The protruding part 140 includes a first protrusion 141, a second protrusion 142, and a third protrusion 143. However, the present disclosure is not limited thereto, and the protruding part 140 may have four or more protrusions.

Referring to FIG. 2, the protruding part 140 is disposed on the first inorganic layer 151 which does not overlap the second inorganic layer 152. However, the present disclosure is not limited thereto, and in case where the second inorganic layer 152 covers the entire surface of the first inorganic layer 151 in the plan view, the protruding part 140 may be formed on the second inorganic layer 152. Also, referring to FIGS. 1 and 2, the protruding part 140 is disposed between the first dam 131 and the second dam 132 in the plan view.

Referring to FIG. 1, the protruding part 140 surrounds the light emitting part 120 in the plan view. A height of the protruding part 140 may be greater than or equal to the height of the light emitting part 120. Since the protruding part 140 having a predetermined height surrounds the light emitting part 120, a length of a penetration path of moisture of oxygen increases when moisture or oxygen introduced from the outside penetrates into the light emitting part 120 along the interface between the layers. As the length of the penetration path of moisture or oxygen increases, movement of moisture or oxygen introduced from the outside may be stagnant or may be absorbed by another layer of the lighting device 100, before reaching the light emitting part 120. For example, moisture or oxygen introduced from the outside may be absorbed by the protruding part 140. Accordingly, moisture or oxygen may be blocked, rather than reaching the light emitting part 120. The protruding part 140 may include a moisture absorbent (or getter) for blocking moisture or oxygen.

According to an embodiment of the present disclosure, the protruding part 140 includes a polymer resin and a moisture absorbent dispersed in the polymer resin. As the polymer resin, for example, an acrylic resin, a methacrylic resin, a polyester resin, a PET resin, a polyethylene resin, a polypropylene resin, or a mixture thereof may be used. However, the polymer resin is not limited thereto, and other known polymer resins may be used for forming the protruding part 140.

There is no particular limitation on the kind of the moisture absorbent. Commercially available moisture absorbents may be used as the moisture absorbent of the protruding part 140 according to an embodiment of the present disclosure. The moisture absorbent may be formed of a metal of Group 2A or an oxide of a metal of Group 2A. For example, the moisture absorbent may include at least one selected from among calcium (Ca), barium (Ba), calcium oxide (CaO), magnesium oxide (MgO), and barium oxide (BaO).

The polymer resin constituting the protruding part 140 serves as a binder for dispersing and fixing the moisture absorbent.

Since the protruding part 140 includes the moisture absorbent, moisture or oxygen introduced from the outside may be absorbed by the protruding part 140, and thus, the lighting device 100 may have excellent moisture or oxygen blocking ability.

Referring to FIG. 2, a cover layer 180 is disposed on the protruding part 140. The cover layer 180 faces the substrate 110 and is disposed in the entire region on the substrate 110 overlapping the protruding part 140 and the light emitting part 120.

A material of the cover layer 180 is not limited. In cases where the lighting device 100 is a bottom emission type in which light is emitted in a direction toward the substrate 110, the cover layer 180 may be formed of a reflective metal. In cases where the lighting device 100 is a top emission type in which light is emitted in a direction toward the cover layer 180, the cover layer 180 may be formed of glass or light-transmissive plastic.

The cover layer 180 may also be formed as an inorganic layer. For example, a third inorganic layer may be formed on an adhesive layer 170 and used as the cover layer 180.

Referring to FIG. 2, the adhesive layer 170 is disposed between the substrate 110 and the cover layer 180. More specifically, the adhesive layer 170 is disposed between the second inorganic layer 152 and the cover layer 180 and between the protruding part 140 and the cover layer 180. The adhesive layer 170 serves to fix the cover layer 180.

There is no particular limitation on the kind of material used to form the adhesive layer 170. The adhesive layer 170 may be formed of an adhesive polymer resin. As the adhesive polymer resin, for example, an acrylic resin, a urethane resin, a siloxane resin, a mixture of an olefin resin and an epoxy resin, and the like, may be used.

Although not shown, a sealing layer may be disposed at the edge of the cover layer 180 and the substrate 110 to combine the cover layer 180 and the substrate 110.

Figure 4:
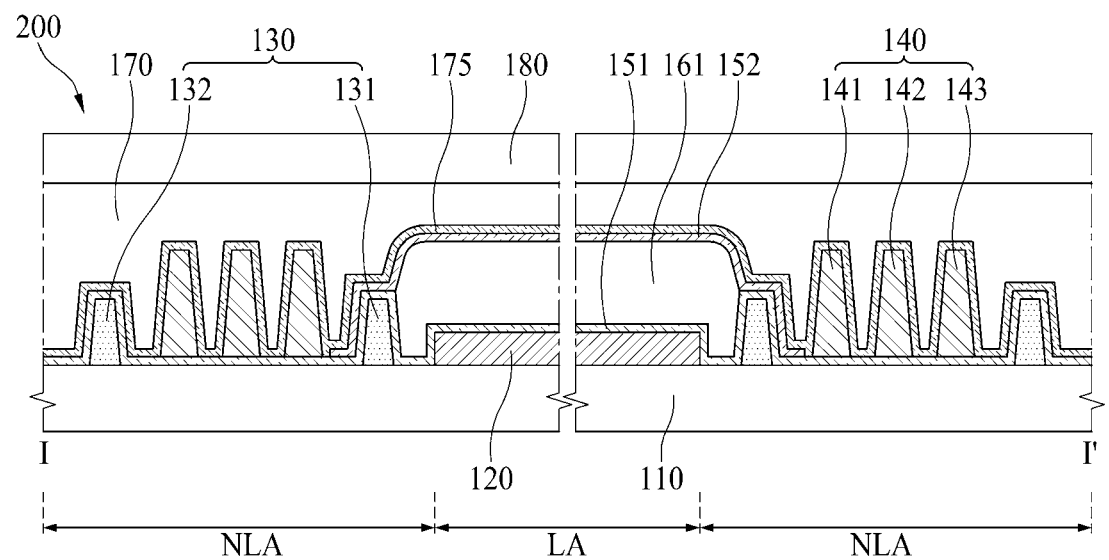
FIG. 4 is a cross-sectional view of a lighting device according to another embodiment of the present disclosure.

FIG. 4 is a cross-sectional view of a lighting device 200 according to another embodiment of the present disclosure. Hereinafter, in order to avoid repetition, a description of the components already described above will be omitted.

The lighting device 200 according to another embodiment of the present disclosure further includes a primer layer 175 as compared with the lighting device 100 disclosed in FIG. 2. More specifically, the lighting device 200 of FIG. 4 further includes a primer layer 175 disposed between the protruding part 140 and the adhesive layer 170. The primer layer 175 is also disposed between the second inorganic layer 152 and the adhesive layer 170.

The primer layer 175 improves adhesion between the adhesive layer 170 and other layers. In addition, the primer layer 175 fills concave recesses between the first protrusion 141 and the second protrusion 142, and between the second protrusion 142 and the third protrusion 143 constituting the protruding part 140, thereby preventing the occurrence of a void in the process of forming the adhesive layer 170.

In order to form the primer layer 175, a compound including a polyfunctional compound or a functional group having excellent reactivity may be used. For example, the primer layer 175 may be formed of an epoxy resin. However, the present disclosure is not limited thereto, and other known compounds may be used for forming the primer layer 175.

Figure 5:
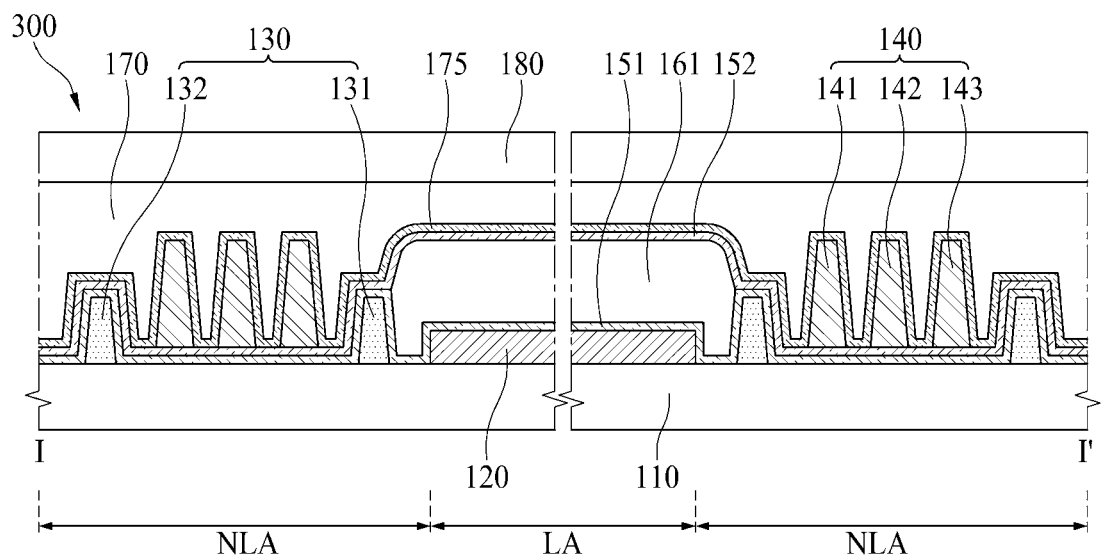
FIG. 5 is a cross-sectional view of a lighting device according to another embodiment of the present disclosure.

FIG. 5 is a cross-sectional view of a lighting device 300 according to another embodiment of the present disclosure.

Compared with FIG. 4, the second inorganic layer 152 included in a lighting device 300 illustrated in FIG. 5 covers the entire surface of the first inorganic layer 151 in the plan view. In FIG. 5, the first inorganic layer 151 and the second inorganic layer 152 have the same area in the plan view.

As described above, the first inorganic layer 151 and the second inorganic layer 152 may be formed in various shapes. The second inorganic layer 152 may have an area greater than the first inorganic layer 151 in the plan view.

Figure 6:
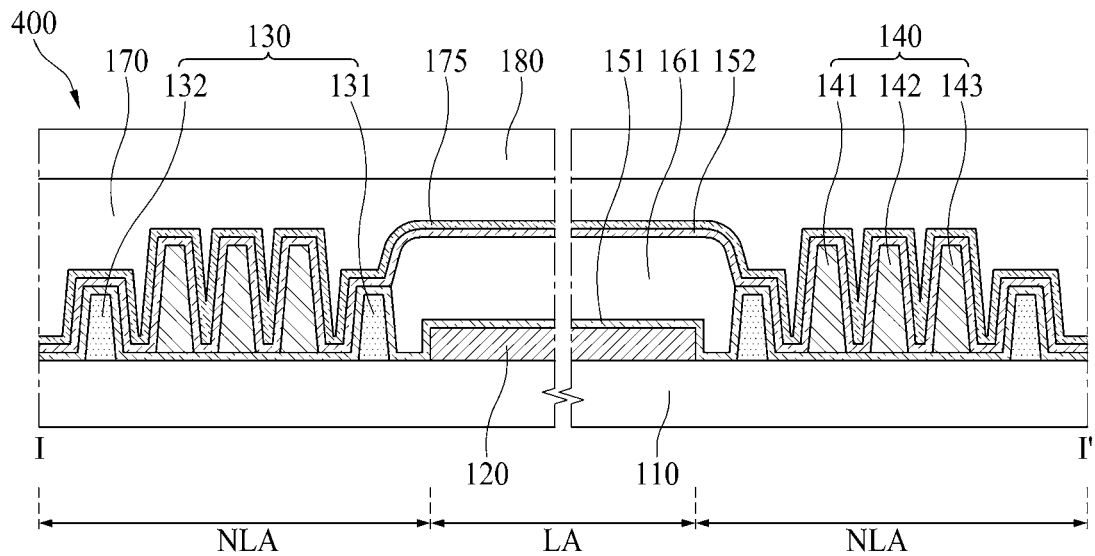
FIG. 6 is a cross-sectional view of a lighting device according to another embodiment of the present disclosure.

FIG. 6 is a cross-sectional view of a lighting device 400 according to another embodiment of the present disclosure.

Compared with FIG. 5, the protruding part 140 of the lighting device 400 illustrated in FIG. 6 is disposed between the first inorganic layer 151 and the second inorganic layer 152. In this case, the protruding part 140 may be formed in the process of forming the first organic layer 161. For example, the first organic layer 161 and the protruding part 140 may be formed together in one process. Thus, process cost may be reduced.

Another embodiment of the present disclosure provides a display apparatus 500.

Figure 7:
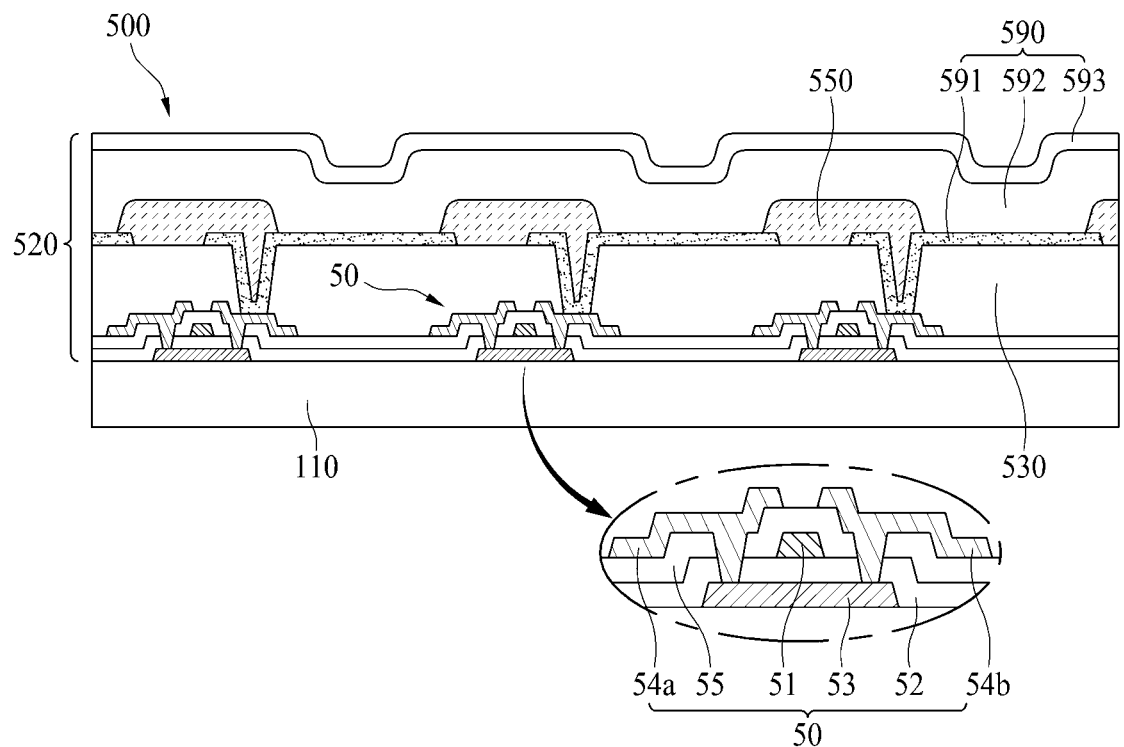
FIG. 7 is a partial cross-sectional view of a display apparatus according to another embodiment of the present disclosure.

FIG. 7 is a partial cross-sectional view of a display apparatus 500 according to another embodiment of the present disclosure. FIG. 7 illustrates only the substrate 110 and a display part 520 of the display apparatus 500. The display part 520 of the display apparatus 500 corresponds to the light emitting part 120 of the lighting devices 100, 200, 300, and 400 illustrated in FIGS. 2, 4, 5, and 6. Therefore, in a case where the display part 520 of FIG. 7 is applied to the light emitting part 120 of the lighting devices 100, 200, 300, 400 illustrated in FIGS. 2, 4, 5 and 6, a display apparatus 500 according to another embodiment is formed.

In detail, the display apparatus 500 according to another embodiment of the present disclosure includes a substrate 110 having a light emitting area LA and a non-emitting region NLA around the light emitting area LA, the display part 520 on the light emitting area LA, a first inorganic layer 151 in the display part 520 and the non-light emitting area NLA, a first organic layer 161 on the first inorganic layer 151 overlapping the display part 520, a second inorganic layer 152 on the first organic layer 161, a protruding part 140 on the first inorganic layer 151 in the non-light emitting area NLA, and a cover layer 180 on the protruding part 140.

The display apparatus 500 according to another embodiment of the present disclosure may further include a dam part 130 in the non-light emitting area NLA of the substrate 110. The dam part 130 includes a first dam 131 and a second dam 132 spaced apart from each other. The first dam 131 surrounds the display part 520 in the plan view and the second dam 132 is spaced apart from the first dam 131 and surrounds the first dam 131.

The display apparatus 500 according to another embodiment of the present disclosure may further include an adhesive layer 170 between the substrate 110 and the cover layer 180. In the display apparatus 500, the adhesive layer 170 may be disposed between the second inorganic layer 152 and the cover layer 180 and between the protruding part 140 and the cover layer 180. The adhesive layer 170 serves to fix the cover layer 180.

Also, the display apparatus 500 according to another embodiment of the present disclosure may further include a primer layer 175 disposed between the protruding part 140 and the adhesive layer 170. The primer layer 175 is also disposed between the second inorganic layer 152 and the adhesive layer 170.

The substrate 110, the first inorganic layer 151, the first organic layer 161, the second inorganic layer 152, the protruding part 140, the dam part 130, the adhesive layer 170, and the primer layer 175 have already been described, and thus, the display apparatus 500 according to another embodiment of the present disclosure will be described in more detail below on the basis of the display part 520 illustrated in FIG. 7 to avoid repetition.

A display apparatus 500 according to another embodiment of the present disclosure includes the substrate 110 and the display part 520 on the substrate 110. The substrate 110 has a light emitting area LA and a non-light emitting area NLA around the light emitting area LA, and the display part 520 is disposed on the substrate 110 in the light emitting area LA.

Referring to FIG. 7, the display part 520 includes a thin film transistor (TFT) 50, a planarization layer 530, a first electrode 591, a bank layer 550, an organic layer 592, and a second electrode 593.

The TFT 50 is disposed on the substrate 110 of the light emitting area LA and includes a semiconductor layer 53, a gate insulating layer 52, a gate electrode 51, a source electrode 54a, a drain electrode 54b, and an interlayer insulating layer 55.

The semiconductor layer 53 is patterned and disposed on the substrate 110, and the gate insulating layer 52 is disposed on the semiconductor layer 53. The gate electrode 51 is patterned and disposed on the gate insulating layer 52 and the interlayer insulating layer 55 is disposed on the gate electrode 51. The source electrode 54a and the drain electrode 54b are disposed on the interlayer insulating layer 55, spaced apart from each other, and connected to the semiconductor layer 53 through a contact hole formed to penetrate through the gate insulating layer 52 and the interlayer insulating layer 55.

The planarization layer 530 is disposed on the TFT 50 to planarize an upper surface of the substrate 110. The planarization layer 530 may be formed of an organic insulating layer such as a photosensitive resin but is not limited thereto.

The first electrode 591 is disposed on the planarization layer 530. The first electrode 591 is connected to the drain electrode 54b or the source electrode 54a of the TFT 50 through the contact hole provided in the planarization layer 530.

The bank layer 550 is disposed on the first electrode 591 and the planarization layer 530 to define pixel areas. For example, as the bank layer 550 is disposed in a matrix structure at a boundary region between a plurality of pixels, the pixel areas may be defined by the bank layer 550.

The organic layer 592 is disposed on the first electrode 591. The organic layer 592 may also be disposed on the bank layer 550. For example, the organic layer 592 may be connected to each other between neighboring pixels, without being separated for each pixel.

The organic layer 592 includes an organic light emitting layer. The organic layer 592 may include one organic light emitting layer and may include two or more vertically stacked organic light emitting layers. From this organic layer 592, light having any one of red, green, and blue colors may be emitted, and white light may also be emitted.

The second electrode 593 is disposed on the organic layer 592.

The first electrode 591, the organic layer 592, and the second electrode 593 may be stacked to form an organic light emitting diode 590. Accordingly, the display apparatus 500 according to another embodiment of the present disclosure is an organic light emitting display apparatus.

The organic light emitting diode 590 may serve as a light amount regulating layer in the display apparatus 500. Although not shown, in case where the organic layer 592 emits white light, the individual pixels may include a color filter for filtering white light emitted from the organic layer 592 by wavelengths. The color filter is formed on a movement path of light. In the case of a so-called bottom emission type in which light emitted from the organic layer 592 travels toward the lower substrate 110, the color filter is disposed below the organic layer 592, and in the case of a so-called top emission type in which light emitted from the organic layer 592 travels in the direction toward the second electrode 593, the color filter is disposed on the organic layer 592.

Hereinafter, a method of manufacturing the lighting device 300 according to another embodiment of the present disclosure will be described with reference to FIGS. 8A to 8H. FIGS. 8A to 8H illustrate a process of manufacturing the lighting device 300 according to another embodiment of the present disclosure.

Figure 8A:
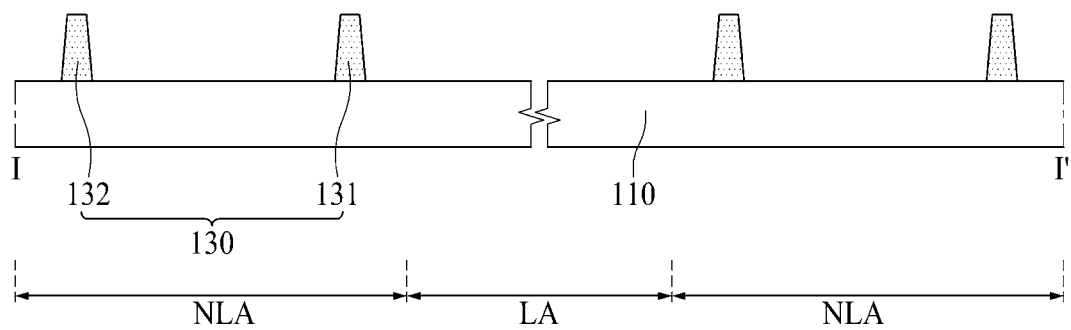
FIGS. 8A to 8H are cross-sectional views illustrating a sequential process of manufacturing a lighting device according to another embodiment of the present disclosure.

Referring to FIG. 8A, first, the substrate 110 having a light emitting area LA and a non-emitting region NLA is prepared, and the dam part 130 is formed on the substrate 110 of the non-light emitting area NLA. The dam part 130 includes the first dam 131 and the second dam 132 and surrounds the light emitting area LA.

Figure 8B:
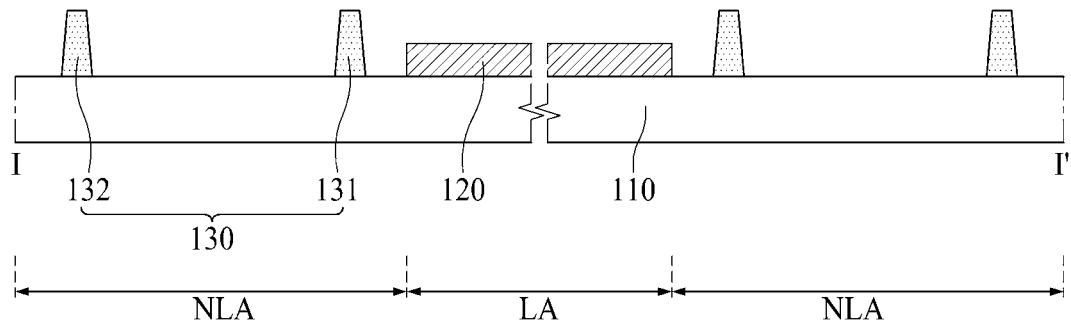

Referring to FIG. 8B, a light emitting part 120 is formed in the light emitting area LA of the substrate 110 having the light emitting area LA and the non-light emitting area NLA. The light emitting part 120 includes at least one organic light emitting diode 190 (refer to FIG. 3). Further, the light emitting part 120 includes one or more lines (not shown) for driving the organic light emitting diode 190.

Figure 8C:
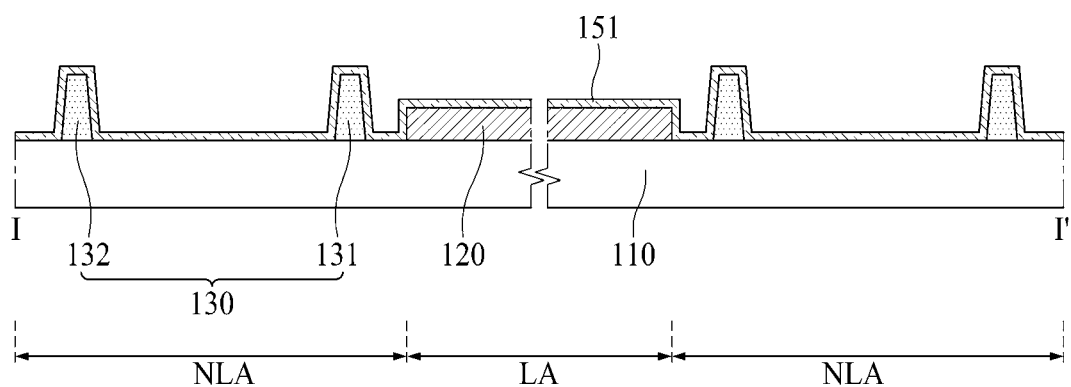

Referring to FIG. 8C, the first inorganic layer 151 is formed on the light emitting part 120 and the non-light emitting area NLA. The first inorganic layer 151 may be formed of silicon oxide, silicon nitride, metal oxide, or metal nitride through sputtering, CVD, or IBAD.

Figure 8D:
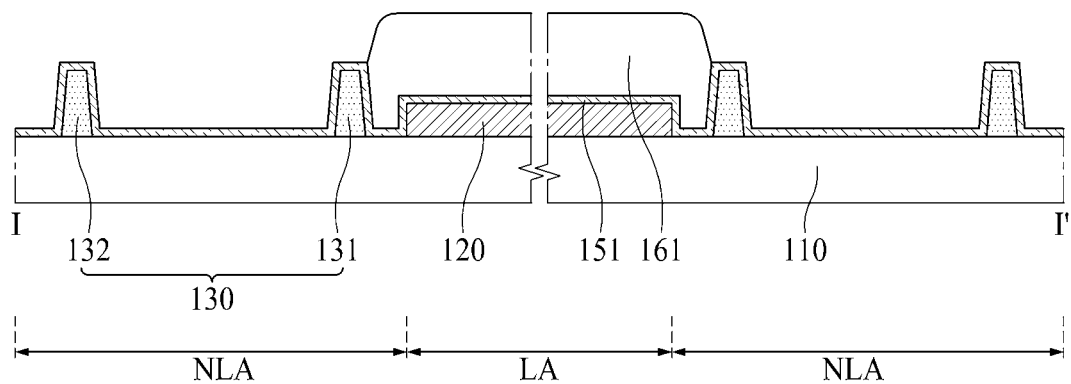

Referring to FIG. 8D, the first organic layer 161 is formed on the first inorganic layer 151 to overlap the light emitting part 120. The first organic layer 161 may be formed by applying or vaporizing a liquid or vaporized monomer and subsequently curing a coated or deposited material by heat or light. For example, the first organic layer 161 may be formed by an ink-jet method.

In the process of forming the first organic layer 161, the first dam 131 serves as a dam to limit flow of the organic material for forming the first organic layer 161. Accordingly, the first organic layer 161 is formed in a region defined by the first dam 131.

Figure 8E:
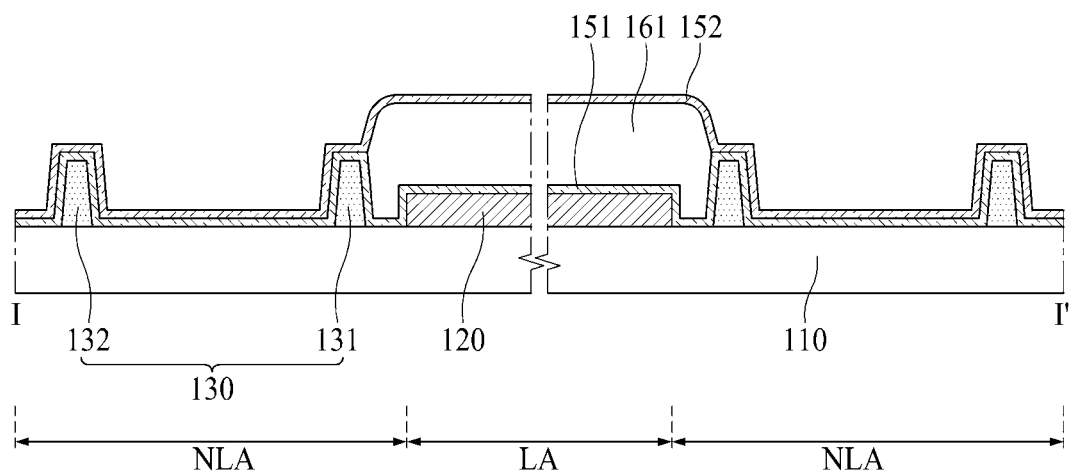

Referring to FIG. 8E, the second inorganic layer 152 is formed on the first organic layer 161. The second inorganic layer 152 completely covers an upper surface of the first organic layer 161 and is disposed on the first inorganic layer 151. The second inorganic layer 152 may be formed of silicon oxide, silicon nitride, metal oxide, or metal nitride through sputtering, CVD, IBAD, or the like, like the first inorganic layer 151.

Figure 8F:
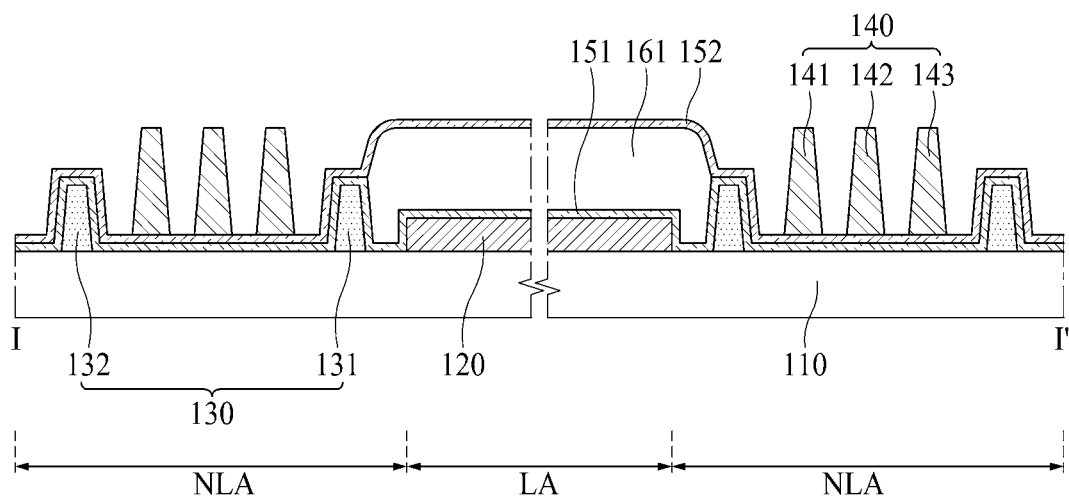

Referring to FIG. 8F, the protruding part 140 is formed on the first inorganic layer 151 in the non-light emitting area NLA. As illustrated in FIG. 8F, in case where the second inorganic layer 152 is disposed on the first inorganic layer 151, the protruding part 140 is formed on the second inorganic layer 152 on the first inorganic layer 151. The protruding part 140 includes the first protrusion 141, the second protrusion 142, and the third protrusion 143. The protruding part 140 may have four or more protrusions.

The protruding part 140 is formed to surround the light emitting part 120 in the plan view. The protruding part 140 includes a polymer resin and a moisture absorbent dispersed in the polymer resin.

Figure 8G:
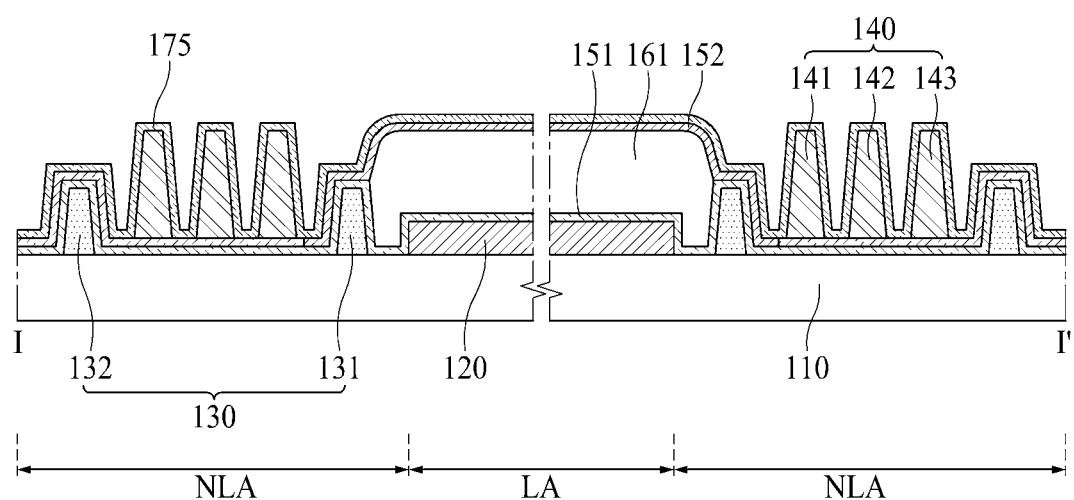

Referring to FIG. 8G, the primer layer 175 is formed on the entire surface of the substrate 110 including the second inorganic layer 152 and the protruding part 140. The primer layer 175 may be formed of a compound including a polyfunctional compound or a functional group having excellent reactivity.

The primer layer 175 improves adhesion between the adhesive layer 170 and other layers and may fill a concave recess between the first protrusion 141, the second protrusion 142, and the third protrusion 143 constituting the protruding part 140.

Figure 8H:
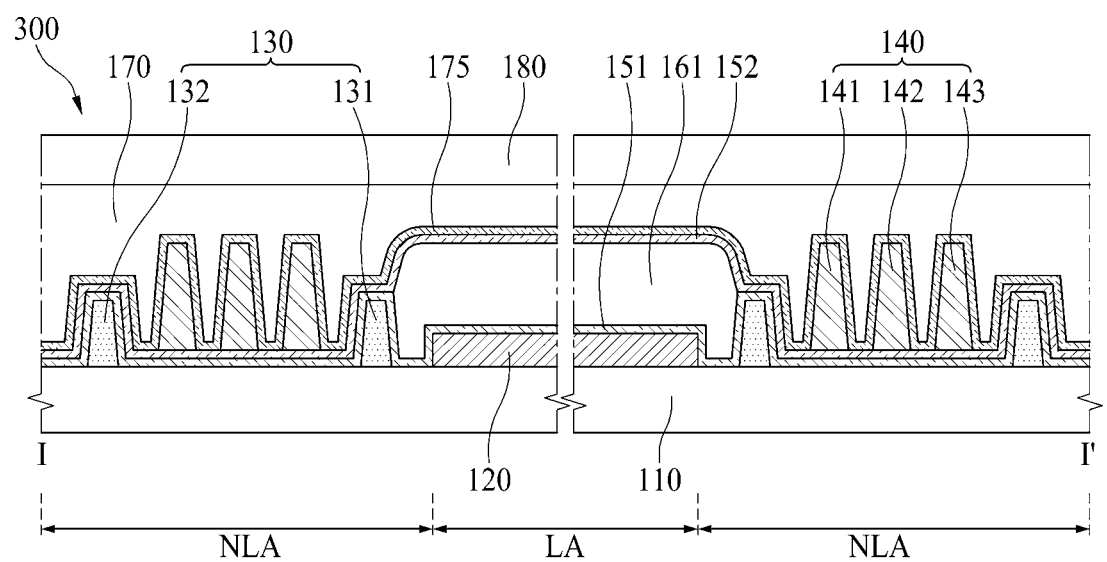

Referring to FIG. 8H, the cover layer 180 is formed on the protruding part 140. The cover layer 180 faces the substrate 110 and is disposed in the entire region of the substrate 110 overlapping the protruding part 140 and the light emitting part 120.

In a case where the lighting device 100 is a bottom emission type in which light is emitted in the direction toward the substrate 110, the cover layer 180 may be formed of a reflective metal. In case where the lighting device 100 is a top emission type in which light is emitted in the direction toward the cover layer 180, the cover layer 180 may be formed of glass or light-transmissive plastic. The cover layer 180 may also be formed of an inorganic layer.

Also, the adhesive layer 170 is formed between the substrate 110 and the cover layer 180. More specifically, the adhesive layer 170 is formed between the second inorganic layer 152 and the cover layer 180 and between the protruding part 140 and the cover layer 180. The adhesive layer 170 serves to fix the cover layer 180 to another layer.

The lighting device 300 according to another embodiment of the present disclosure may be manufactured by the manufacturing method described above. However, the manufacturing method according to an embodiment of the present disclosure is not limited thereto, and in case where the display part 520 of FIG. 7 is formed instead of the light emitting part 120, the display apparatus 500 may be manufactured by the manufacturing method illustrated in FIGS. 8A to 8H, or by another manufacturing method.

The lighting devices 100, 200, 300, and 400 and the display apparatus 500 according to the embodiments of the present disclosure includes the encapsulation structure including the stacked structure of the inorganic layer, the organic layer, and the inorganic layer and the protruding part 140 on the inorganic layer, thus preventing penetration of moisture, oxygen, or the like, to the inside of the lighting devices 100, 200, 300, and 400 and the display apparatus 500. Although the lighting devices 100, 200, 300, and 400 and the display apparatus 500 are exposed to an external environment, the light emitting part 120 and the display apparatus 500 are not damaged. Thus, the lighting devices 100, 200, 300, and 400 according to the embodiments of the present disclosure may be particularly useful for vehicles, and the display apparatus 500 may be useful as an outdoor display apparatus and vehicle display apparatus, as well as an indoor display apparatus.

According to an embodiment of the present disclosure, penetration of moisture ($H_2O$), oxygen ($O_2$), and the like, to the inside of the lighting device and the display apparatus is prevented by the encapsulation structure as the stacked structure of the inorganic layer, the organic layer, and the inorganic layer and the protruding part on the inorganic layer, whereby the lighting device and the display apparatus may be effectively protected. In addition, since the light emitting part of the lighting device and the display apparatus according to an embodiment of the present disclosure is not damaged, the lighting device and the display apparatus may have excellent preservation reliability. Thus, the lighting device and the display apparatus according to an embodiment of the present disclosure may be useful as an outdoor lighting device and display apparatus such as a lighting device and the display apparatus for a vehicle, as well as an indoor lighting device and display apparatus.

It will be apparent to those skilled in the art that various modifications and variations may be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A lighting device comprising:
   a substrate having a light emitting area where a light emitting part is placed on and a non-light emitting area that does not emit light, the non-light emitting area surrounding the light emitting area;
   a dam part on the substrate in the non-light emitting area, but not in the light emitting area, the dam part including a first dam and a second dam;
   a first inorganic layer on both an upper surface of the light emitting part in the light emitting area and on an upper surface of the dam part in the non-light emitting area, the first inorganic layer being disposed on both an upper surface of the first dam and an upper surface of the second dam;
   a first organic layer on the first inorganic layer, the first organic layer overlapping the light emitting part;
   a second inorganic layer on the first organic layer;
   a protruding part on the first inorganic layer in the non-light emitting area without the first inorganic layer being on an upper surface of the protruding part, but the protruding part not being in the light emitting area, wherein a height of the protruding part is greater than or equal to a height of the light emitting part; and
   a cover layer on the protruding part,
   wherein the first dam surrounds the light emitting part in a plan view, and the second dam is spaced apart from the first dam, and the second dam surrounds the first dam and the protruding part, and
   wherein the protruding part is disposed between the first dam and the second dam at a side outside of the light emitting part, in the non-light emitting area, and
   wherein both the first dam and the second dam are disposed between the substrate and the first inorganic layer.

2. The lighting device of claim 1, wherein the light emitting part includes at least one organic light emitting diode.

3. The lighting device of claim 1, wherein the dam part has a height greater than a height of the light emitting part.

4. The lighting device of claim 1, wherein the first dam defines a disposition area of the first organic layer, wherein the first organic layer is disposed in the disposition area.

5. The lighting device of claim 1, wherein the first inorganic layer and the second inorganic layer are in direct contact with each other in the non-light emitting area.

6. The lighting device of claim 1, wherein the protruding part includes a polymer resin and a moisture absorbent dispersed in the polymer resin.

7. The lighting device of claim 1, wherein the protruding part surrounds the light emitting part in a plan view.

8. The lighting device of claim 1, wherein the protruding part is disposed on the second inorganic layer in the non-light emitting area.

9. The lighting device of claim 1, further comprising:
   an adhesive layer between the protruding part and the cover layer.

10. The lighting device of claim 9, further comprising:
    a primer layer between the protruding part and the adhesive layer.

11. A display apparatus comprising:
    a substrate having a light emitting area where a display part is placed on and a non-light emitting area that does not emit light, the non-light emitting area surrounding the light emitting area;
    a dam part on the substrate in the non-light emitting area, but not in the light emitting area, the dam part including a first dam and a second dam;
    a first inorganic layer on both an upper surface of the display part in the light emitting area and an upper surface of the dam part in the non-light emitting area, the first inorganic layer being disposed on both an upper surface of the first dam and an upper surface of the second dam;
    a first organic layer on the first inorganic layer, the first organic layer overlapping the display part;
    a second inorganic layer on the first organic layer;
    a protruding part on the first inorganic layer in the non-light emitting area without the first inorganic layer being on an upper surface of the protruding part, but the protruding part not being in the light emitting area, wherein a height of the protruding part is greater than or equal to a height of the display part; and
    a cover layer on the protruding part,
    wherein the display part includes a plurality of organic light emitting diodes,
    wherein the first dam surrounds the display part in a plan view, and the second dam is spaced apart from the first dam, and the second dam surrounds the first dam and the protruding part, and
    wherein the protruding part is disposed between the first dam and the second dam at a side outside of the light emitting area, in the non-light emitting area, and
    wherein both the first dam and the second dam are disposed between the substrate and the first inorganic layer.

12. The display apparatus of claim 11, further comprising:
    an adhesive layer between the protruding part and the cover layer.

13. The display apparatus of claim 12, further comprising:
    a primer layer between the protruding part and the adhesive layer.

14. A lighting device comprising:
    a substrate;
    a light emitting part on the substrate, the light emitting part overlapping a portion of the substrate;
    dam parts surrounding the light emitting part and not overlapping the light emitting part on the substrate, the dam parts including a first dam and a second dam;
    an encapsulation layer on the light emitting part;
    a first protruding part that surrounds the light emitting part and non-overlapping the light emitting part,
    a second protruding part that surrounds the first protruding part and the light emitting part, the second protruding part non-overlapping with the first protruding part and the light emitting part, wherein the first protruding part and the second protruding part has a height greater than or equal to a height of the light emitting part, wherein the encapsulation layer comprises:

a first inorganic layer on the light emitting part, a first organic layer on the first inorganic layer and overlapping the light emitting part, and a second inorganic layer on the first organic layer and overlapping the light emitting part, and wherein the first inorganic layer is disposed on both an upper surface of the light emitting part and an upper surface of the dam parts, and the first inorganic layer is disposed on both an upper surface of the first dam and an upper surface of the second dam, and both the first protruding part and the second protruding part are disposed on the first inorganic layer without the first inorganic layer being on an upper surface of the first protruding part and without the first inorganic layer being on an upper surface of the second protruding part, wherein the first dam surrounds the light emitting part in a plan view, and the second dam is spaced apart from the first dam, and the second dam surrounds the first dam, the first protruding part and the second protruding part, and wherein the first protruding part and the second protruding part are disposed between the first dam and the second dam at a side outside of the light emitting part, in a non-light emitting area that does not emit light, and wherein both the first dam and the second dam are disposed between the substrate and the first inorganic layer.

15. The lighting device of claim 14, wherein each of the first dam and the second dam has a height greater than the height of the light emitting part.

16. The lighting device of claim 14, further comprising a primer layer on the first protruding part and the second protruding part.

17. The lighting device of claim 14, wherein both the first protruding part and the second protruding part are disposed on the second inorganic layer.

18. The lighting device of claim 14, wherein both the first protruding part and the second protruding part are disposed between the first inorganic layer and the second inorganics layer.

19. The lighting device of claim 1, wherein the dam part is partly formed of a moisture absorbent.

20. The lighting device of claim 1, wherein the first organic layer is partly formed of a moisture absorbent.

\* \* \* \* \*